(12) United States Patent
Oda et al.

(10) Patent No.: US 6,450,805 B1
(45) Date of Patent: Sep. 17, 2002

(54) HOT PLATE COOLING METHOD AND HEAT PROCESSING APPARATUS

(75) Inventors: Tetsuya Oda, Tamana; Mitsuhiro Tanoue, Tamana-gun; Toshichika Takei, Kumamoto, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/634,299

(22) Filed: Aug. 9, 2000

(30) Foreign Application Priority Data

Aug. 11, 1999 (JP) .......................................... 11-227512

(51) Int. Cl.⁷ .............................................. F27D 15/02
(52) U.S. Cl. ........................ 432/247; 432/230; 432/5; 432/81; 118/724; 118/728; 219/405
(58) Field of Search ........................ 432/5, 6, 81, 230, 432/247; 118/627, 642, 722, 724, 725, 728; 219/390, 405, 411; 392/416, 418

(56) References Cited

U.S. PATENT DOCUMENTS

| | | | | |
|---|---|---|---|---|
| 4,081,313 A | * | 3/1978 | McNeilly et al. | ............ 118/724 |
| 5,414,244 A | * | 5/1995 | Imahashi | ..................... 392/416 |
| 5,588,827 A | * | 12/1996 | Muka | ............................. 432/5 |
| 5,937,541 A | * | 8/1999 | Weigand et al. | ............... 34/565 |
| 6,193,507 B1 | * | 2/2001 | White et al. | ................. 118/724 |

* cited by examiner

*Primary Examiner*—Gregory Wilson
(74) *Attorney, Agent, or Firm*—Rader, Fishman & Grauer PLLC (57) ABSTRACT

In a heat processing apparatus for heating a wafer on a hot plate, a black plate having at least a rear face practically having a color with a JIS lightness of 0V to 4V is positioned above the hot plate. Moreover, cooling air is blown out from nozzles onto the rear face of the hot plate so that the temperature of the hot plate can be cooled rapidly.

19 Claims, 13 Drawing Sheets

HOT PLATE COOLING METHOD AND HEAT PROCESSING APPARATUS

CROSS-REFERENCE TO RELATED APPLICATIONS

This application is based upon and claims the benefit of priority from the prior Japanese Patent Application No. 11-227512, filed Aug. 11, 1999, the entire contents of which are incorporated herein by reference.

BACKGROUND OF THE INVENTION

The present invention relates to a method of cooling a hot plate for heating a substrate and a heat processing apparatus.

In the process of photo-resist processing in semiconductor device fabrication, various kinds of heat processing such as heat processing (pre-baking) after a resist solution is applied on the front face of a semiconductor wafer (hereinafter referred to as "a wafer"), heat processing (post-exposure baking) after exposure of a pattern is performed, and the like are performed.

Such heat processing is usually performed by a heat processing apparatus. This heat processing apparatus has a disc-shaped thick hot plate made of aluminum in a processing container, and performs heat processing for the wafer by placing the wafer to be processed on the hot plate and heating the hot plate to a predetermined temperature by a heating element incorporated in the hot plate.

Incidentally, there are cases where temperatures in heat processing are different, for example, the wafer is heated to 140° C. or the wafer is heated to 90° C. lower than this temperature, depending on the types of semiconductor devices to be formed, types of resist solutions, and types of processes, and the like. In these cases, for example, when the hot plate which have been performing heat processing at 140° C. up to the present is used for heat processing at 90° C., it is required to temporarily lower the temperature of the hot plate, for example, to 90° C., in which case a conventional heat processing apparatus of this type is not specially equipped with a mechanism for cooling and the like, and thus the hot plate is cooled naturally.

However, if cooling is left only to natural cooling when the hot plate is cooled to the predetermined temperature, the temperature in the surface of the hot plate is lowered in a ununiform state, and a considerably long time is required for reaching the predetermined temperature and obtaining uniform surface temperature, which is undesirable. To improve this, if dedicated heat processing apparatus are previously prepared for respective processing temperatures, for example, 140° C. and 90° C., a problem of cooling time can be settled, but if so, a large number of heat processing apparatus become necessary, and as a result, a coating and developing apparatus in which usually a various kinds of resist processing apparatus are put together and used is enlarged, which is undesirable.

BRIEF SUMMARY OF THE INVENTION

It is an object of the present invention to provide a method capable of cooling a hot plate of a heat processing apparatus more rapidly than in a conventional method, and a heat processing apparatus having a function capable of suitably carrying out the cooling method.

According to a first aspect of the present invention, there is provided a hot plate cooling method comprising the steps of heating a hot plate for placing a substrate thereon and heating the substrate, and positioning an object whose portion facing the hot plate has a color with good heat absorption efficiency above the hot plate.

According to the aforesaid structure, the object of which the portion facing the hot plate has a color with good heat absorption efficiency is positioned above the hot plate, whereby radiant heat from the hot plate can be effectively absorbed, resulting in the promotion of cooling of the hot plate and uniform cooling.

According to a second aspect of the present invention, there is provided a heat processing apparatus comprising a hot plate for heating a substrate, and a nozzle for blowing cooling gas onto the rear face of the hot plate.

According to the aforesaid structure, the temperature of the hot plate can be lowered more rapidly than in the conventional apparatus, and moreover dust and the like do not adhere to a substrate mounting face since air is blown onto the rear face side of the hot plate.

According to a third aspect of the present invention, there is provided a heating processing apparatus comprising a hot plate for heating a substrate, and an object moving freely over the hot plate whose face opposite the hot plate has a color with good heat absorption efficiency.

According to the aforesaid structure, the object whose portion facing the hot plate has a color with good heat absorption efficiency can be positioned above the hot plate, whereby radiant heat from the hot plate can be effectively absorbed, resulting in the promotion of cooling of the hot plate and uniform cooling.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
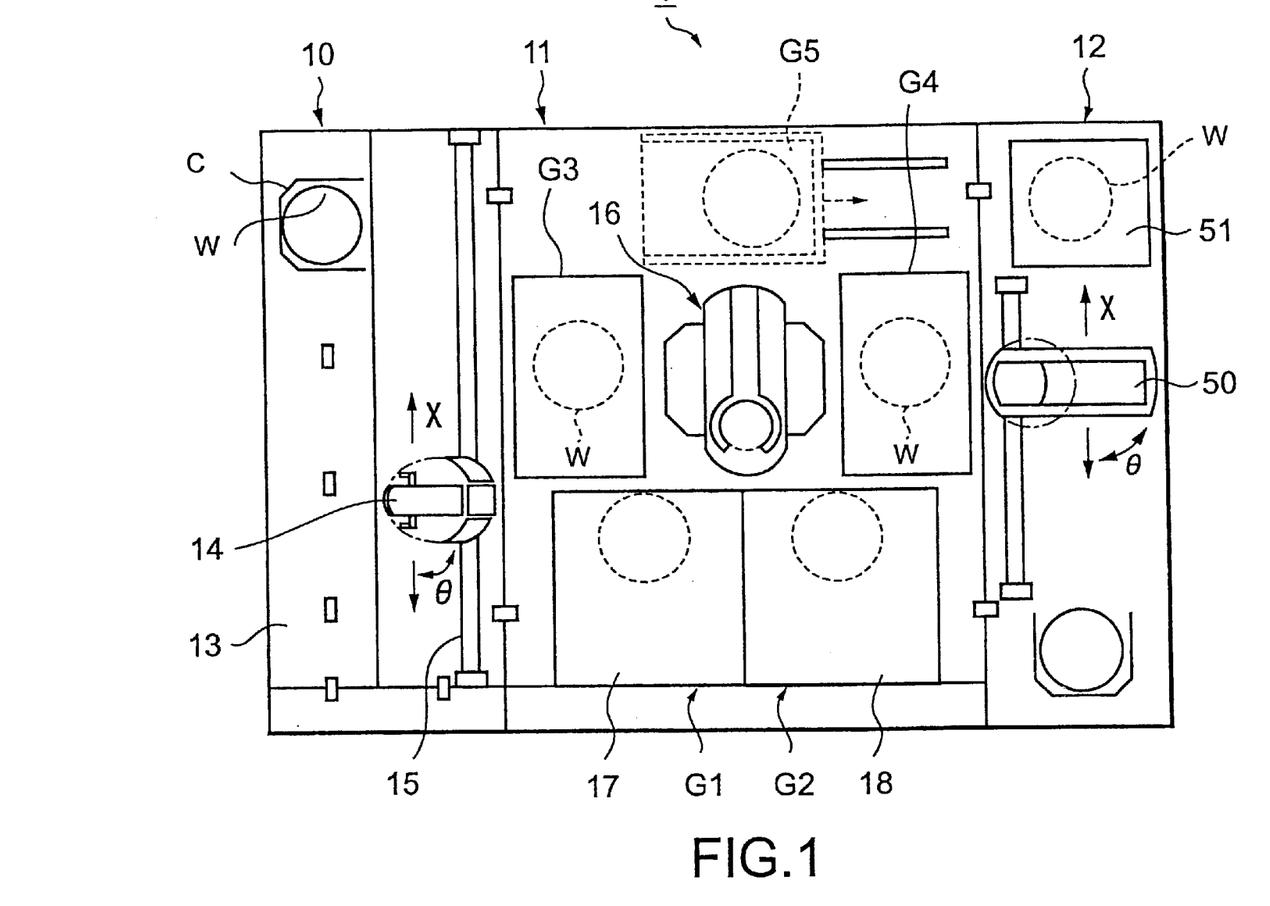
FIG. 1 is a plan view of a coating and developing processing apparatus in which a heating and cooling processing unit according to an embodiment of the present invention is incorporated.
Figure 2:
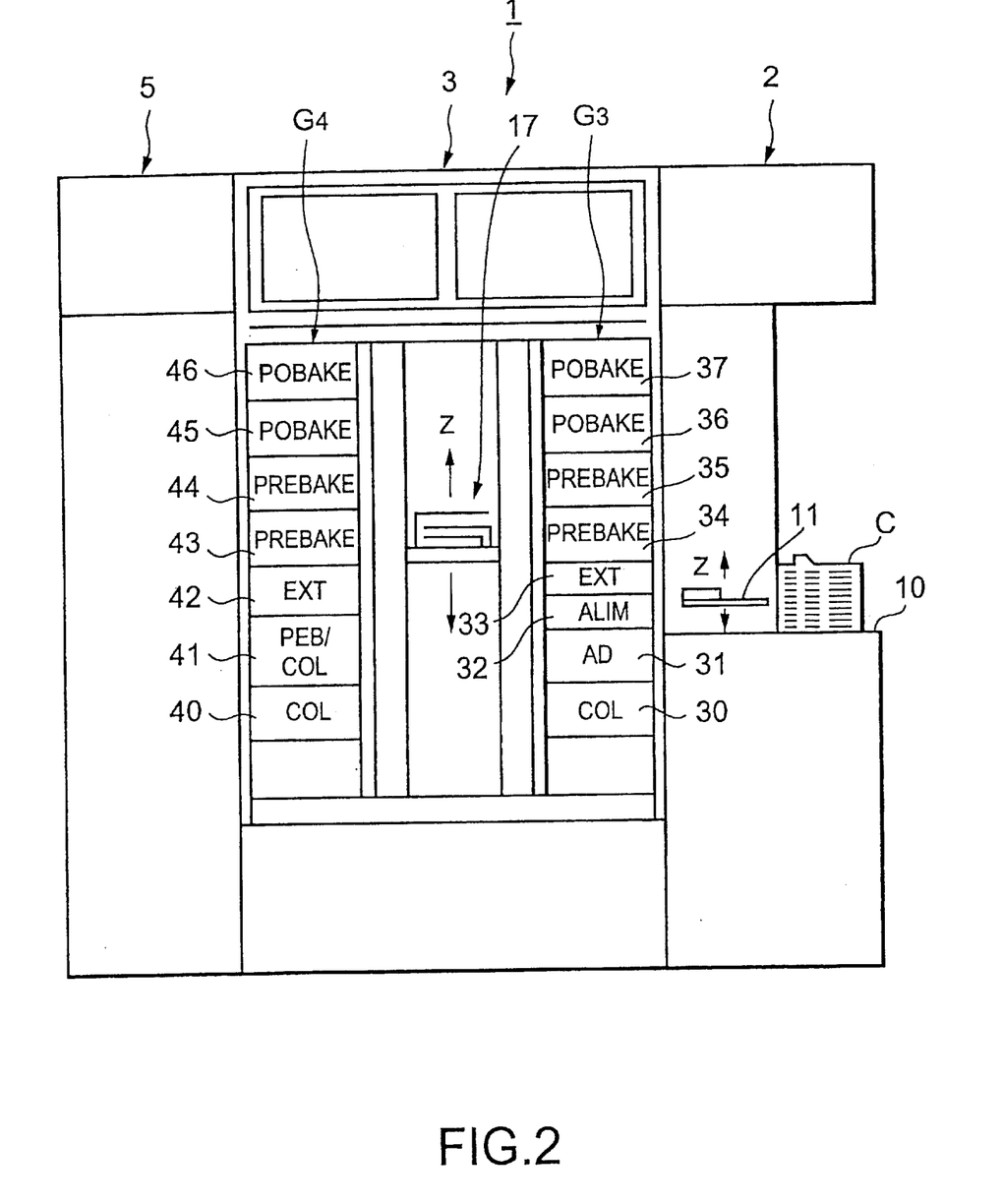
FIG. 2 is a rear view of the coating and developing processing apparatus in FIG. 1.

A preferred embodiment of the present invention will be described below. FIG. 1 is a plan view of a coating and developing processing apparatus 1 in which an apparatus according to this embodiment is incorporated. FIG. 2 is a rear view of the coating and developing processing apparatus 1. This coating and developing processing apparatus 1 has structure in which a cassette station 10 for transferring, for example, 25 wafers W per cassette C, as a unit, from/to the outside into/from the coating and developing processing apparatus 1 and carrying the wafer W into/out of the cassette C, a processing station 11 in which various kinds of processing units each for performing predetermined processing for the wafers W one by one in coating and developing processes are stacked at multi-stages, and an interface section 12 for receiving and sending the wafer W from/to an aligner (not illustrated) provided adjacent to the processing station 11 are integrally connected.

In the cassette station 10, cassettes C can be freely mounted in a line in an X-direction (a vertical direction in FIG. 1) at predetermined positions on a cassette mounting table 13. A wafer transfer body 14 movable in the X-direction and in the direction of arrangement of the wafers W housed in the cassette C (a Z-direction, i.e, vertical direction) is provided along a transfer path 15 to be able to selectively get access to each of the cassettes C.

The wafer transfer body 14 is also structured to be able to get access to an alignment unit 32 and an extension unit 33 which are included in a third processing unit group G3 on the processing station 11 side as will be described later.

In the processing station 11, a main transfer machine 16 is provided in the middle thereof, and various kinds of processing units are stacked at multi-stages to compose processing unit groups around the main transfer machine 16. In the coating and developing processing apparatus 1, four processing unit groups G1, G2, G3, and G4 are arranged. The first and second processing unit groups G1 and G2 are arranged at the front of the coating and developing processing apparatus 1, the third processing unit group G3 is arranged adjacent to the cassette station 10, and the fourth processing unit group G4 is arranged adjacent to the interface section 12. It should be mentioned that as an option, a fifth processing unit group G5 shown by the broken line can be separately arranged at the back.

In the first processing unit group G1 and the second processing unit group G2, spinner-type processing units, for example, resist coating units 17 and 18 each for applying a resist to the wafer W to process the wafer W and developing processing units (not illustrated) for supplying a developing solution to the wafer W to process the wafer W are stacked at two stages from the bottom in order respectively.

In the third processing unit group G3, as shown in FIG. 2, oven-type processing units each for performing predetermined processing while the wafer W is placed on a mounting table, for example, a cooling unit (COL) 30 for performing cooling processing, an adhesion unit (AD) 31 for enhancing adhesion of a resist solution and the wafer W, an alignment unit (ALIM) 32 for aligning the wafer W, an extension unit (EXT) 33 for making the wafer W wait, pre-baking units (PREBAKE) 34 and 35 each for performing heat processing before exposure processing, and post-baking units (POBAKE) 36 and 37 for performing heat processing after developing processing, or the like are stacked at eight stages from the bottom in order.

In the fourth processing unit group G4, for example, a cooling unit (COL) 40, a heating and cooling processing unit 41 as a heat processing apparatus according to this embodiment, an extension unit (EXT) 42, pre-baking units (PREBAKE) 43 and 44, post-baking units (POBAKE) 45 and 46, or the like are stacked at seven stages from the bottom in order.

A wafer transfer body 50 is provided in the middle of the interface section 12. The wafer transfer body 50 is structured to be able to get access to the extension unit 42 included in the fourth processing unit group G4, a peripheral aligner 51, and the pattern aligner (not illustrated).

Figure 3:
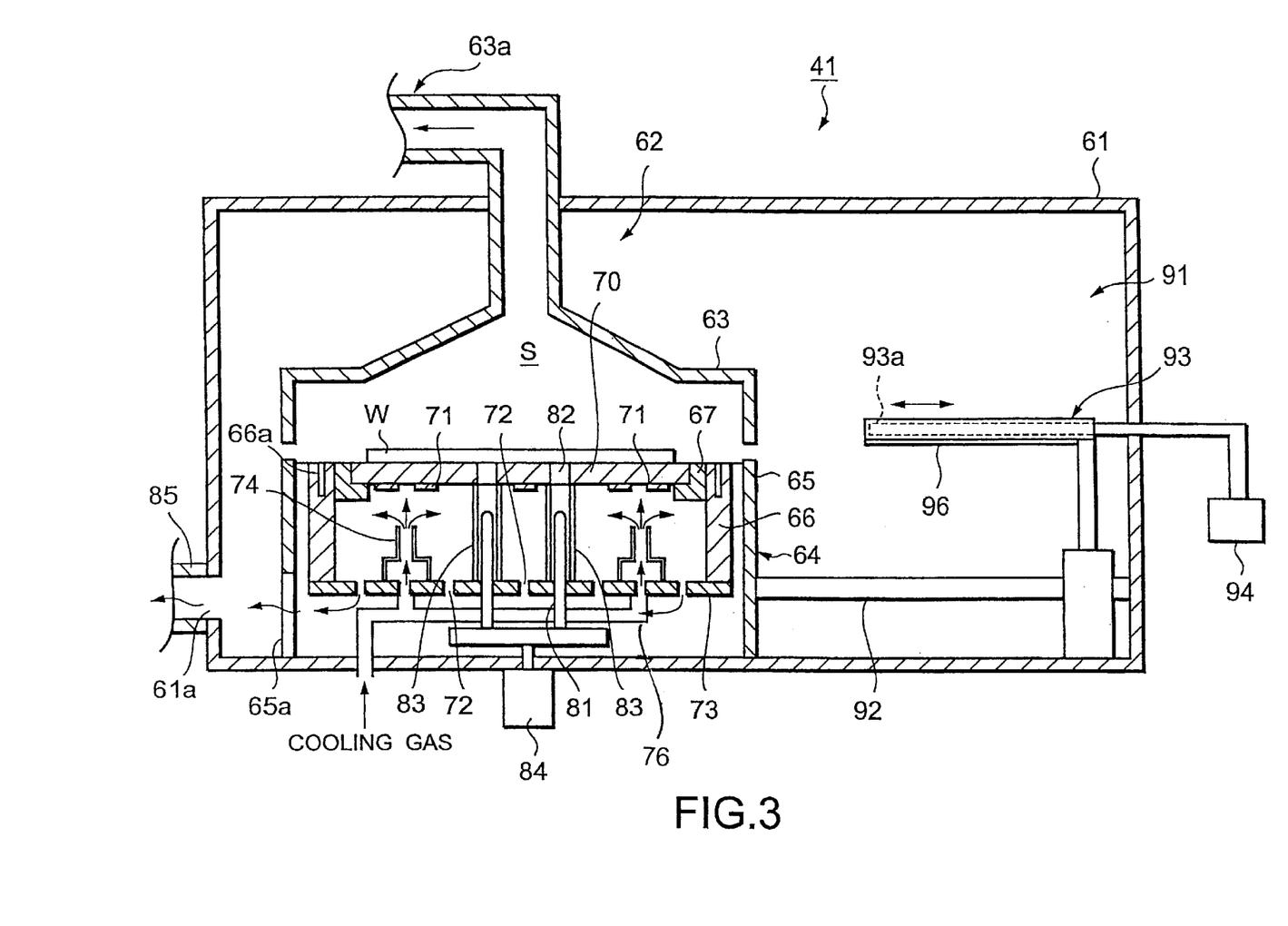
FIG. 3 is a side sectional view of the heating and cooling processing unit according to the embodiment.

Next, the aforesaid heating and cooling processing unit 41 will be explained in detail by means of FIG. 3 and FIG. 4. As shown in FIG. 3, the heating and cooling processing unit 41 has a heating section 62 inside a casing 61, and the heating section 62 includes a lid body 63, which is situated at the upper side and movable up and down, and a hot plate housing section 64 which is situated at the lower side and forms a processing chamber S integrally with the lid body 63.

The lid body 63 has an almost conical shape gradually elevated toward the center and is provided with an exhaust section 63a at the top thereof, and an atmosphere in the processing chamber S is uniformly exhausted from the exhaust section 63a.

The hot plate housing section 64 has an almost cylindrical case 65 at the outer periphery thereof, an almost cylindrical inner case 66 disposed inside the case 65, a support ring 67 with good heat insulating properties fixed in the inner case 66, and a disc-shaped hot plate 70 supported by the support ring 67. An air outlet 66a is provided in the upper face of the inner case 66, and, for example, air, an inert gas, or the like can be blown out into the processing chamber. The processing chamber has spaces in the upper and lower portions thereof with a hot plate 70 between them.

The hot plate 70 is made of, for example, aluminum. Attached to the rear face thereof are heaters 71 which generate heat by electrical supply. Attached to the lower face of the inner case 66 is a perforated base plate 73 in which a large number of ventilation sections 72 are formed, for example, like a punching metal.

Nozzles 74 for blowing out cooling and gas, for example, normal temperature air in the vertical direction toward the rear face of the hotplate 70 are provided at eight points on the base plate 73. As shown in FIG. 4, the arrangement of the nozzles 74 is set so that every four nozzles are situated concentrically and that their positions do not overlap with the positions of temperature sensors 75 for temperature measurement of the hotplate 70 (shown by the symbol x in FIG. 4) in plan view. The nozzles 74 communicate with one another by an air supply pipe 76, and when air is supplied from the outside of the casing 61, air with the same air velocity is blown into the rear face of the hotplate 70 from each of the nozzles 74.

Through-holes 82 are formed at three points in the hot plate 70. Three ascending and descending pins 81 protrude from the hot plate 70 through the through-holes 82 when the wafer W is raised and lowered. Cylindrical guides 83 are disposed vertically between the through-holes 82 and the base plate 73. The cylindrical guides 83 isolate the ascending and descending pins 81 from the atmosphere around the nozzles 74 by covering the outer peripheries of the ascending and descending pins 81. Thanks to these guides 83, the vertical motion of the ascending and descending pins 81 is not impeded by various cords laid under the hot plate 70, and air blown out from the nozzles 74 is prevented from discharging from the through-holes 82 toward the wafer W. The ascending and descending pins 81 are vertically movable by a proper drive unit 84 such as a motor or the like.

A proper exhaust port 65a is formed around the lower portion of the case 65, and also a proper exhaust port 61a is formed beside the lower portion of the casing 61 of the heating and cooling processing unit 41. An exhaust pipe 85 leading to an exhaust section (not illustrated) intensively exhausting air from other processing units of the aforesaid coating and developing processing apparatus 1 is connected to the exhaust port 61a.

Inside the casing 61, a cooling section 91 is provided in addition to the heating section 62 having the aforesaid main structure. The cooling section 91 has a chill plate 93 which functions also as a transfer machine in the casing 61, movable along a moving rail 92 and vertically.

Figure 4:
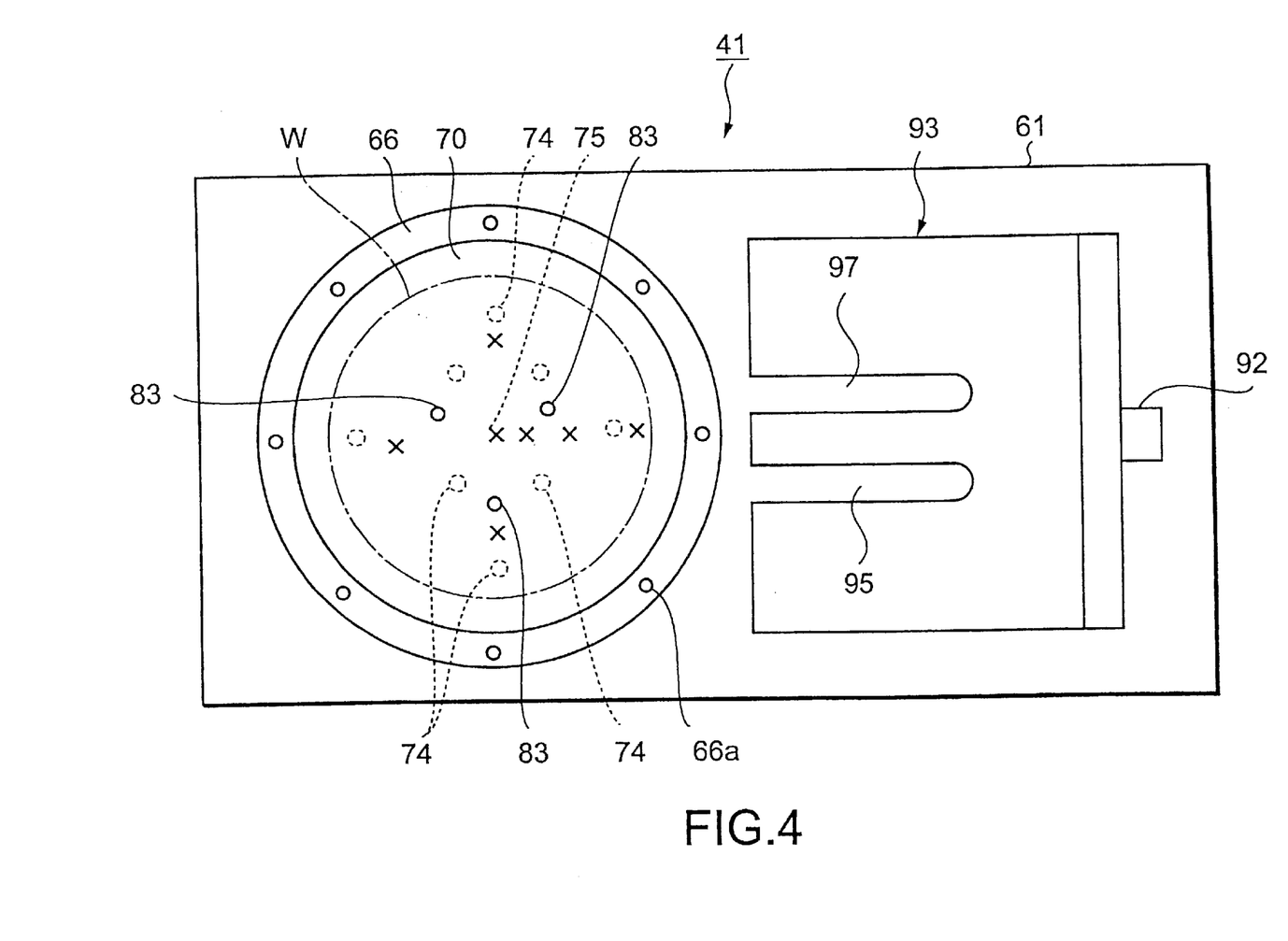
FIG. 4 is a plan view of the heating and cooling processing unit according to the embodiment.
Figure 5:
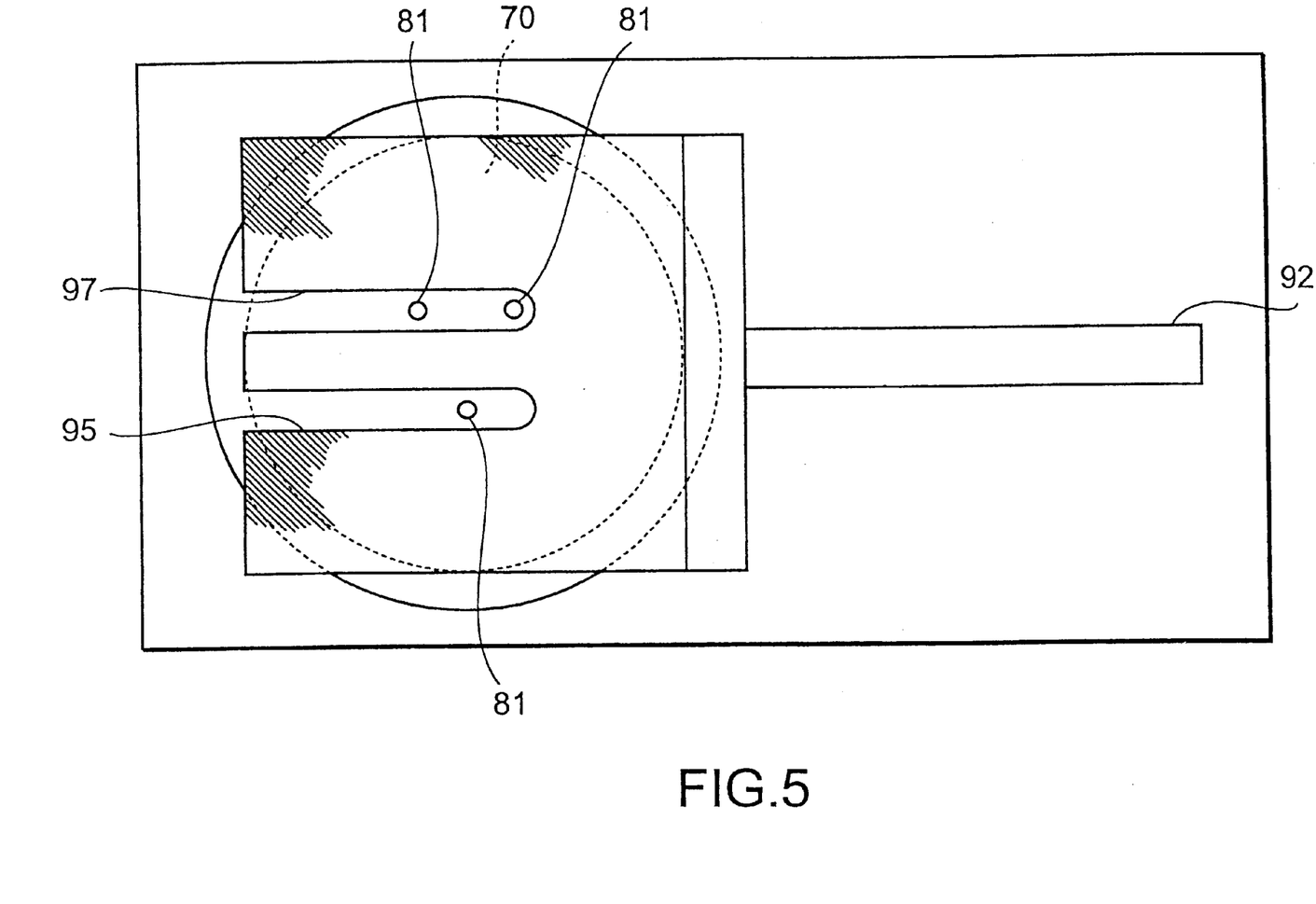
FIG. 5 is a plan view showing the state in which a chill plate in the heating and cooling processing unit according to the embodiment is moved onto a hot plate.

As shown in FIG. 4, the chill plate 93 has an almost square flat plate-shape as a whole, and has structure in which inside the chill plate 93, liquid having a predetermined temperature (23° C., for example) supplied from a constant temperature water supply source 94 provided outside, for example, constant temperature water circulates in a circulating channel 93a in the chill plate 93 to cool the wafer W mounted on the chill plate 93. Slits 95 and 97 are formed at an end on the heating section 62 side in the chill plate 93. These slits 95 and 97 are provided so that the ascending and descending pins 81 are not obstacles when the chill plate 93 moves to the heating section 62 side and is situated on the hot plate 70 as shown in FIG. 5 in order to receive the wafer W on the hot plate 70 supported by the ascending and descending pins 81. Therefore, the chill plate 93 can move freely on the hot plate 70 as shown in FIG. 5.

Figure 6:
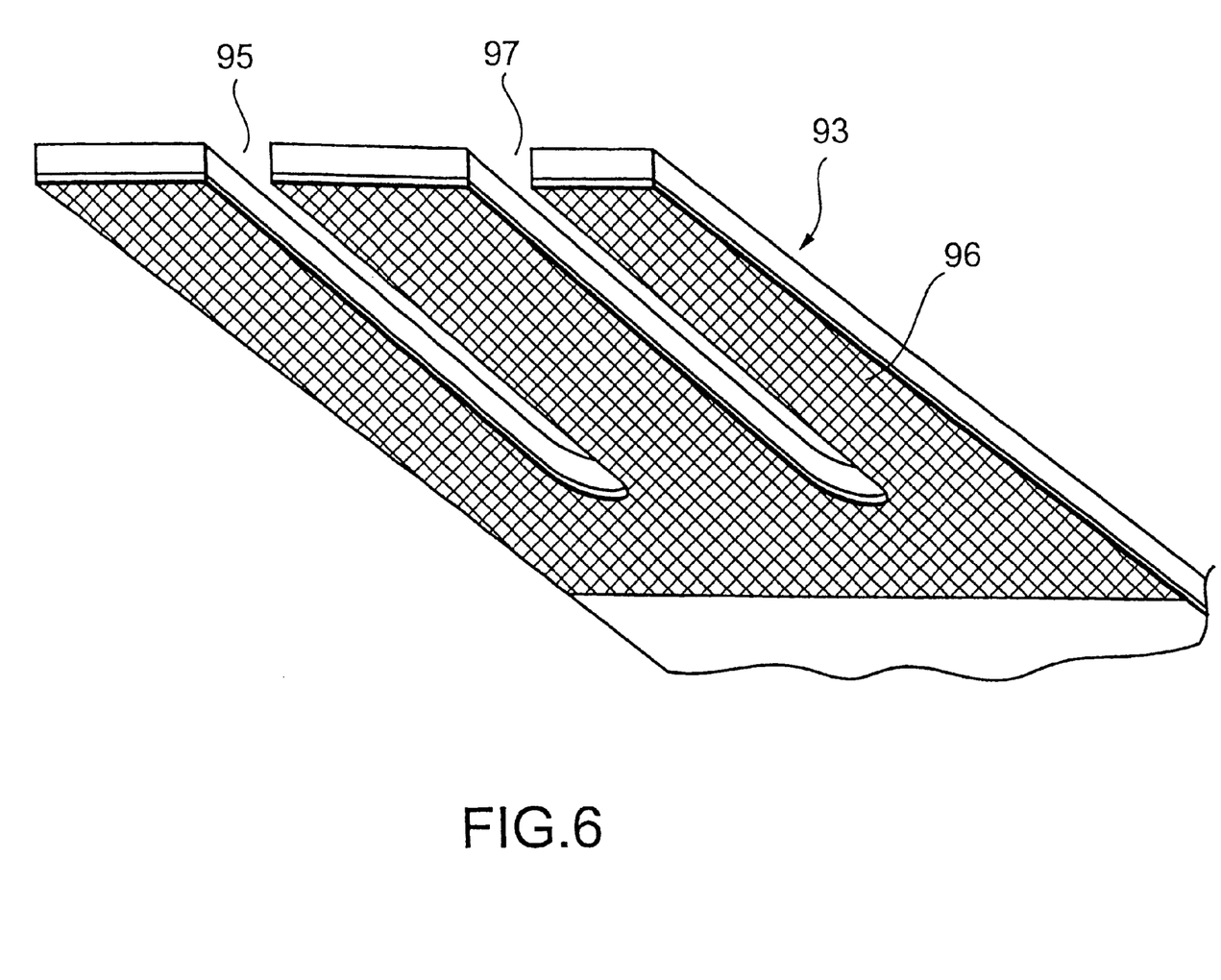
FIG. 6 is a perspective view seen obliquely from below of a black plate in the heating and cooling processing unit according to the embodiment.

As shown in FIG. 6, a black plate 96 is closely attached to the rear face of the chill plate 93, that is, a face that is opposite the hot plate 70 when the chill plate is situated on the hot plate 70. The black plate 96 is made of ceramic or the like, and the color has lightness standardized by JIS, practically in the range of 0V to 4V. The surface (the underside) of the black plate 96 is formed into a roughened surface on which minute recesses and projections are formed, thereby preventing reflection. Incidentally, black is adopted as a color with good heat absorption efficiency in this embodiment, but not limited to this, various kinds of colors such as dark brown, green, blue, and the like can be used if they are dark colors having a JIS lightness of 0V to 4V. The color, having lightness within this range, has good heat absorption efficiency. As for a color with good heat absorption efficiency, the hot plate may be colored or plated with paint or the like, the hot plate itself may be composed of a material of any of the aforesaid colors, or a plate or a film of any of the aforesaid colors may be attached to the surface of the hot plate. Moreover, it is preferable that the hot plate itself is composed of a material with good heat conductivity, for example, metal.

The heating and cooling processing unit 41 according to this embodiment is structured as above, and undertakes post-exposure baking (PEB) and the subsequent cooling processing after exposure of a pattern is performed in the aligner (not illustrated) adjacent to the coating and developing processing apparatus 1. Namely, a chemically amplified resist which is widely used these days needs immediate cooling as well as heat processing after the completion of exposure of a pattern, and the heating and cooling processing unit 41 according to this embodiment satisfies the aforesaid need. More specifically, when the wafer W which has undergone exposure processing is placed on the hot plate 70, the wafer W is heated to 140° C. by the heater 71, for example. When heating for a predetermined period of time is completed, the ascending and descending pins 81 ascend and support the wafer W. In this state, the chill plate 93 moves onto the hot plate 70 and receives the wafer W at which time constant temperature water is circulating in the chill plate 93, and immediately after the wafer W is received by the chill plate 93, cooling processing is started. Accordingly, post-exposure baking (PEB) after exposure is performed swiftly.

Incidentally, temperatures of post-exposure baking are different depending on the processes and types of resists. Hence, not only the case of heating at 140° C. as described above, but also the case of heating at a temperature lower than 140° C., for example, at 90° C. is possible. In this case, it is required to rapidly cool the hot plate 70 to prepare for heating at 90° C., and the heating and cooling processing unit 41 according to this embodiment can suitably cope with such temperature drop of the hot plate.

Figure 7:
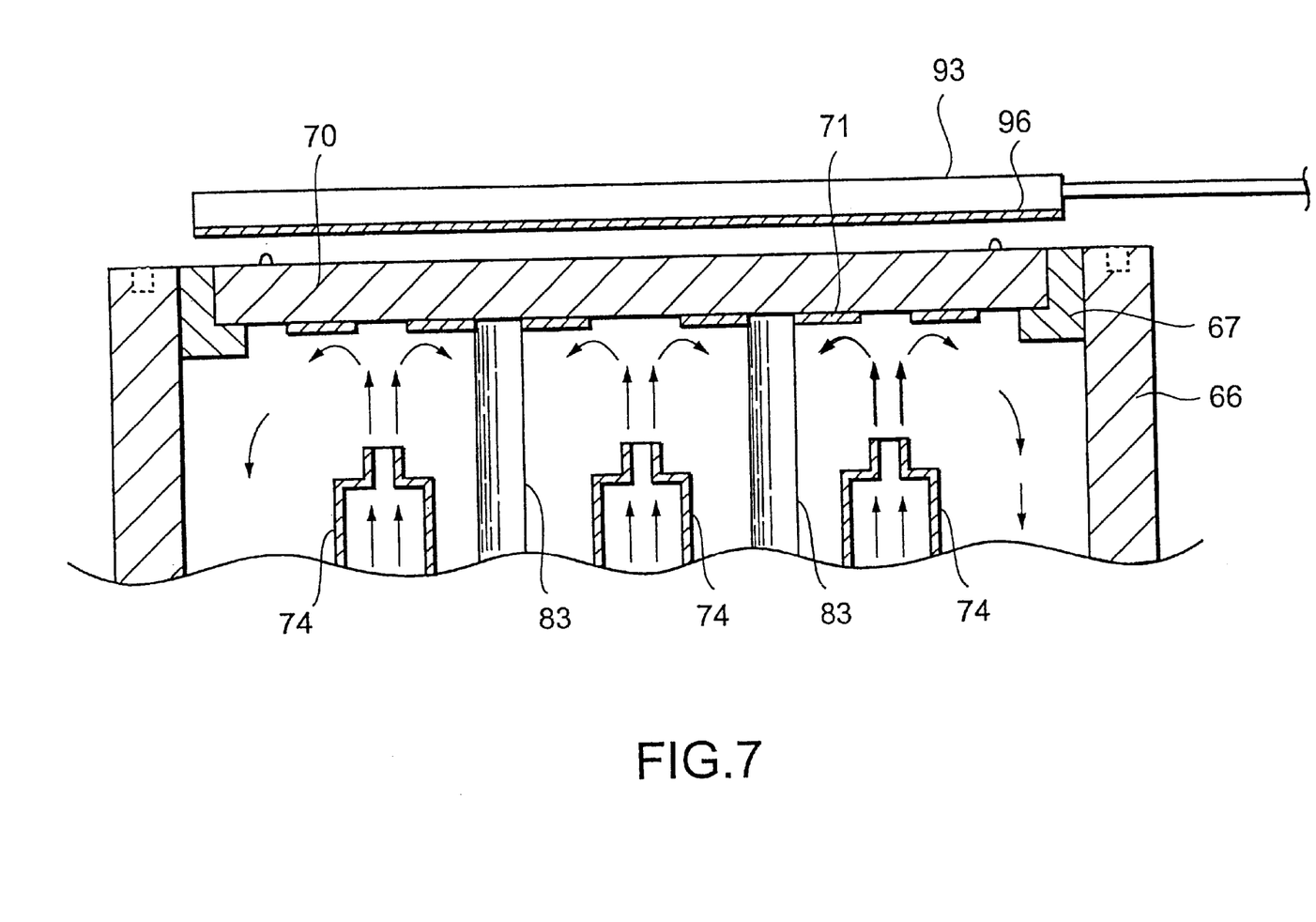
FIG. 7 is a side sectional view showing the state in which the chill plate in the heating and cooling processing unit according to the embodiment is moved onto the hot plate.

More specifically, after heating and cooling processing of the last wafer in a lot which is subjected to heat processing at 140° C. is completed, the chill plate 93 is moved onto the hot plate 70 as shown in FIG. 5. Concurrently with this, as shown in FIG. 7, air with a normal temperature of about 23° C. is blown out from the nozzles 74 onto the rear face of the hot plate 70. Then, the hot plate 70 is first cooled by the normal-temperature air blown onto the rear face thereof. Although the temperature of air discharged from the nozzles 74 is set at 23° C., such temperature that moisture condensation does not occur is desirable. Regarding the temperature of blown gas, gas with a low temperature can improve cooling rate as a matter of course, but gas with normal temperature also can obtain great results as in this embodiment. The gas may be air or any of various kinds of inert gases including nitrogen gas, but preferably the use of dry air from which moisture is removed is recommended.

Meanwhile, since the black plate 96 attached to the rear face of the chill plate 93 covers the front face of the hot plate 70, radiant heat from the front face of the hot plate 70 is absorbed efficiently by this black plate 96. The black plate 96 itself is closely attached to the chill plate 93 which is always cooled by constant-temperature circulating water, and thus the black plate 96 itself is indirectly cooled by the constant-temperature water. Hence, the black plate 96 can continuously and efficiently absorb radiant heat from the hot plate and hot air from the hot plate 70 and cool the hot plate rapidly.

Moreover, since the black plate 96 covers the entire front face of the hot plate 70, it can absorb radiant heat uniformly. Thus, the temperature of hot plate 70 can be lowered uniformly. As described above, the surface of the black plate 96 is formed into a roughened surface, thereby making it possible to prevent reflection and to absorb radiant heat more efficiently. In this embodiment, the use of the black plate 96, the surface of which is roughened, enables the time required for a change in the temperature of the hot plate 70 by 50° C. to be shortened from conventional 180 seconds to 30 seconds.

In this embodiment, the chill plate 93 to which the black plate 96 is attached serves as both of a transfer machine for transferring a substrate and a cooling object for absorbing radiant heat from the hot plate, and therefore it is unnecessary to provide a cooling object specially. Incidentally, not limited to the structure explained above, usually, in a heat processing apparatus, a substrate is carried into/out of the heat processing apparatus by using a transfer machine, and hence it is possible to effectively utilize the transfer machine. Moreover, the black plate 96 is shaped almost exactly into a flat plate to cover the hot plate, and thus can cool the hot plate efficiently.

As described above, the black plate 96 efficiently absorbs radiant heat from the front face of the hot plate 70, whereas air is blown out from the nozzles 74 onto the rear face of the hot plate 70, which makes it possible to very rapidly lower the temperature of the hot plate 70 to a predetermined temperature, for example, 90° C. Consequently, it becomes possible to promptly cope with heating at 90° C. Air from the nozzles 74 is blown onto the rear face of the hot plate, whereby dust and the like do not adhere to the front face of the hot plate, that is, a substrate mounting face.

Air blown out from the nozzles 74 can pass through the vent holes 72 of the base plate 73, and can be exhausted to the outside from the exhaust pipe 85 via the exhaust ports 65*a* and 61*a*, and thereby does not remain in a space under the hot plate 70. Accordingly, also in this regard, the cooling effect of the hot plate 70 is high. The positions at which air is blown out from the nozzles 74 are set at positions away from the temperature sensors 75, whereby the measurement of the temperature of the hot plate 70 by the temperature sensors 75 is not impeded.

In this embodiment, cooling of the hot plate 70 is performed by positioning the black plate 96 above the hot plate 70 and blowing air from the nozzles 74 onto the hot plate 70. In this case, when the temperature of the hot plate 70 reaches a temperature which is a set temperature plus 1.5° C., the chill plate 93 is moved and returned to the cooling section 91. Thereafter, when the temperature of the hot plate 70 reaches a temperature which is the set temperature plus 0.3° C., the supply of air from the nozzles 74 is stopped. By stopping cooling processing at a temperature slightly higher than the set temperature as described above, the occurrence of overshoot in which the temperature of the hot plate 70 is excessively lower than the set temperature is prevented.

It is desirable that the flow rate of air discharged from the nozzles 74 is higher than the exhaust rate of air from the exhaust port 65*a*. Thereby, the inside of a space surrounded by the hot plate 70, the inner case 66, the support ring 67, and the base plate 73 is maintained at a positive pressure, whereby air can be uniformly supplied into the space, and hence air can be uniformly blown onto the surface of the hot plate 70. Consequently, the surface of the hot plate 70 can be cooled uniformly.

Although the aforesaid embodiment is embodied as the heating and cooling processing unit, the structure of a heating processing apparatus alone is suitable as a matter of course. Moreover, although the wafer is used as a substrate, the present invention can be applied to a heat processing apparatus for other square substrates, for example, an LCD substrate.

As described above, in the heat processing apparatus in this embodiment, the temperature of the hot plate can be lowered more rapidly and uniformly than in conventional processing apparatuses. Therefore, even when one heat processing apparatus is used also for heat processing at different temperatures, less time is needed for the change of setting to a different temperature than in the conventional processing apparatuses, resulting in contribution to improvement in throughput.

Aluminum is used as a hot plate in the aforesaid embodiment, but ceramics having the same heat conductivity as aluminum may be used.

Furthermore, in the aforesaid embodiment, a hot plate with a thickness of three millimeters can be used as the hot plate, and the rate of temperature drop of the hot plate can be quickened by decreasing the thickness as described above.

Figure 8:
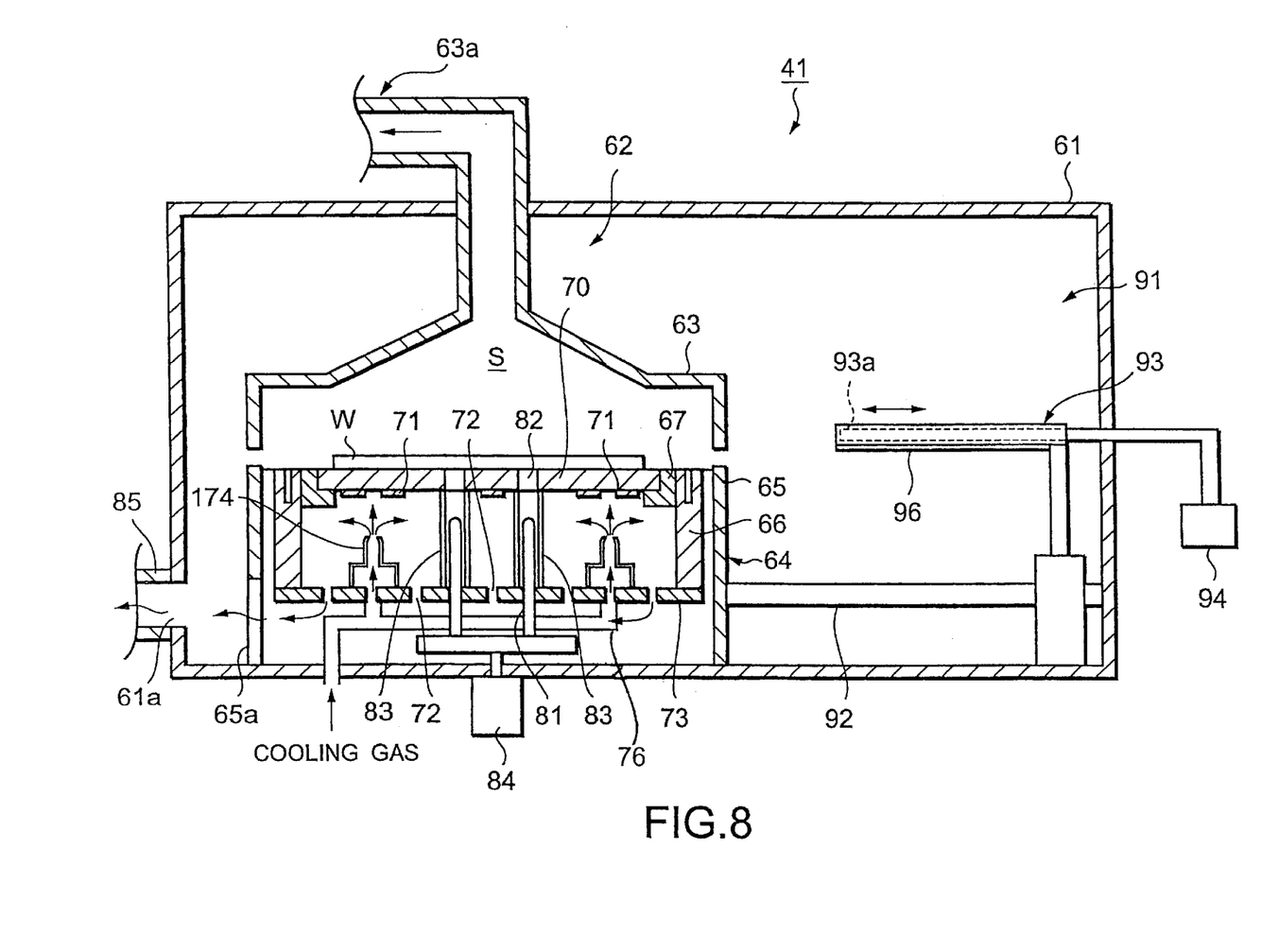
FIG. 8 is a side sectional view of a heating and cooling processing unit according to another embodiment.

Moreover, in the aforesaid embodiment, the tip portion of the nozzle 74 has such a shape that the diameter of the nozzle 74 does not change along the lengthwise direction of the nozzle 74. But, as shown in FIG. 8, such a shape that the diameter of a nozzle 174 changes along the lengthwise direction of the nozzle 174 by narrowing the tip portion of the nozzle 174 is also suitable. The use of the nozzle 174 whose tip portion is narrowed as described above makes more uniform cooling possible.

Figure 9:
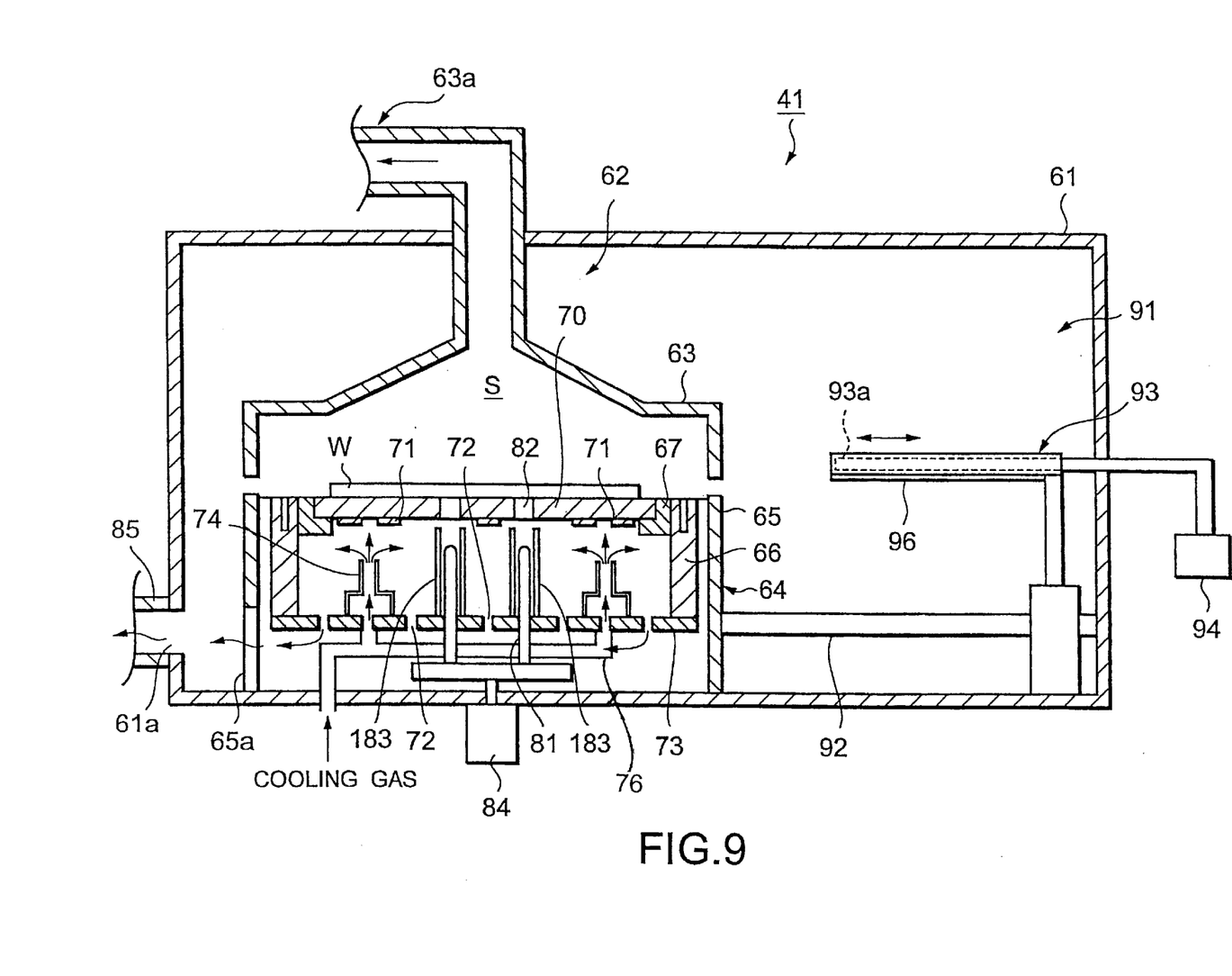
FIG. 9 is a side sectional view of a heating and cooling processing unit according to still another embodiment.

Although the guides 83 are disposed touching the hot plate 70, guides 183 and the hot plate 70 may be disposed a predetermined space apart from each other as shown in FIG. 9. If the guides 83 and the hot plate 70 touch, heat from the hot plate 70 escapes to the guides 83. As a result, the temperature of the hot plate 70 around the positions of the ascending and descending pins 81 changes, and the hot plate 70 has ununiform temperature distribution in the surface thereof. Such ununiform temperature distribution becomes marked as the hot plate 70 has a smaller thickness as thin as 3 mm, but the amount of gas escaping from the hot plate 70 to the guides 83 can be reduced by disposing the guides 83 and the hot plate 70 apart from each other as shown in FIG. 9, thereby allowing temperature distribution in the surface of the hot plate 70 to be made uniform.

Figure 10:
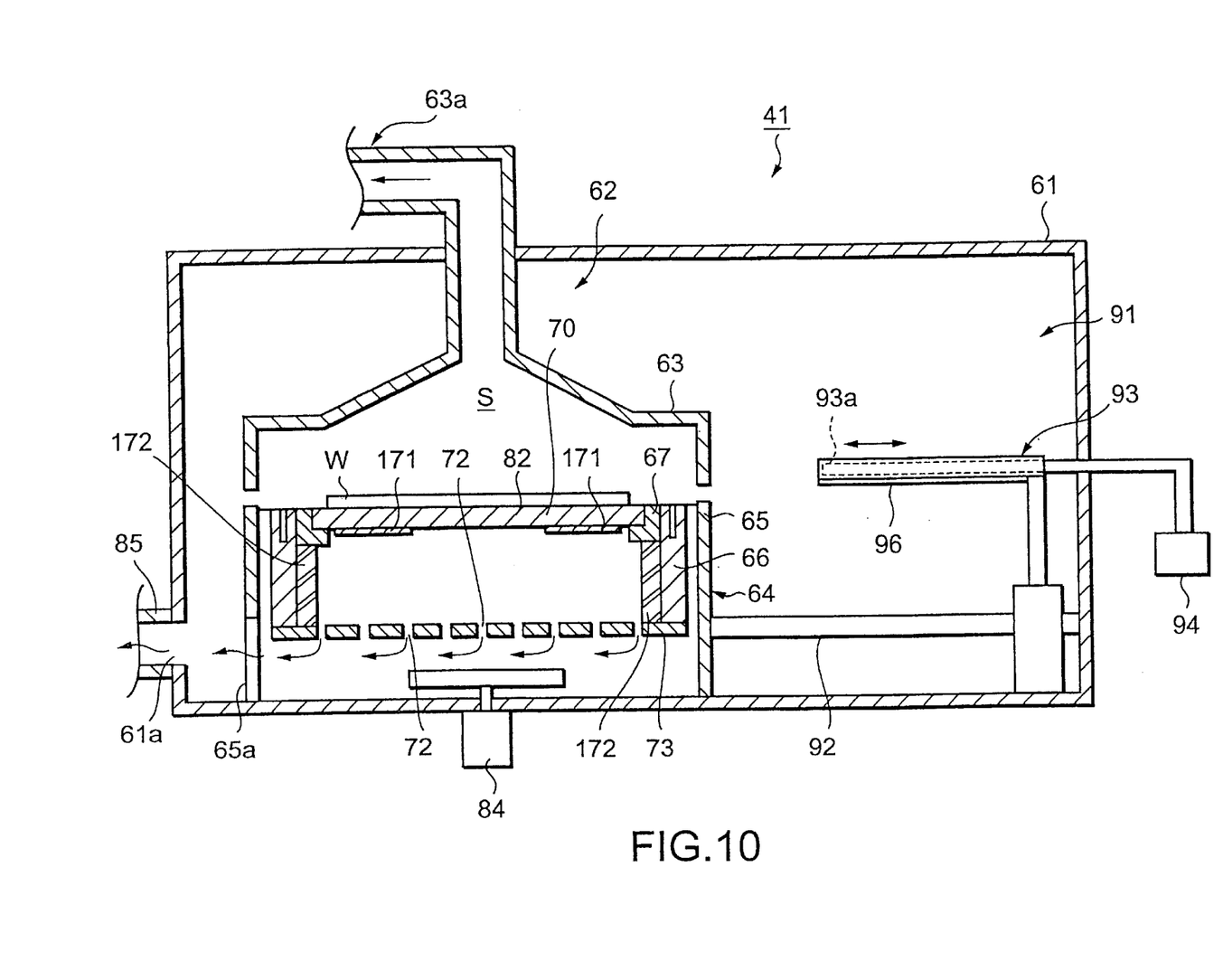
FIG. 10 is a side sectional view of a heating and cooling processing unit according to yet another embodiment.
Figure 11:
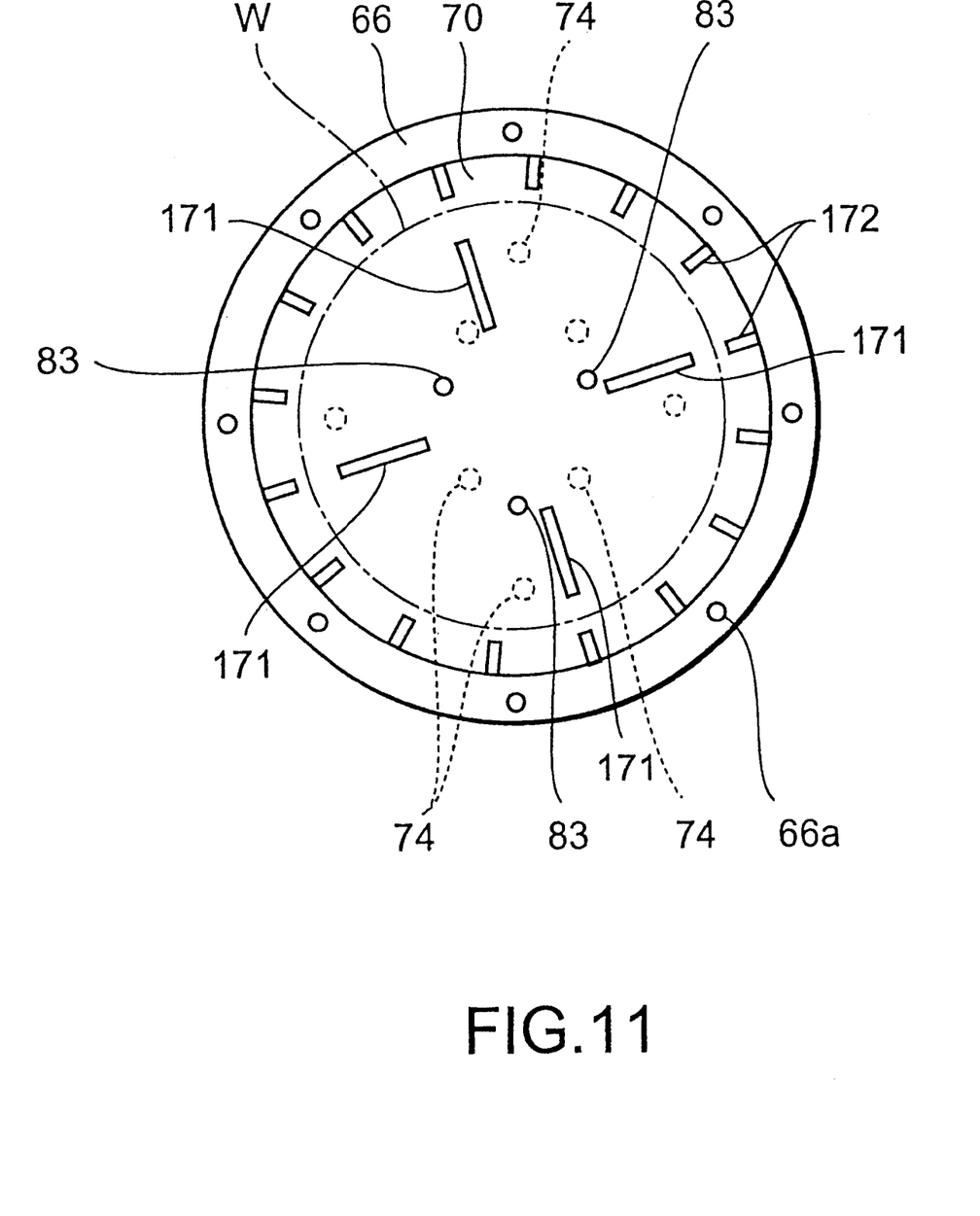
FIG. 11 is a plan view of the heating and cooling processing unit in FIG. 10.

In addition to the structure of the aforesaid embodiment, as shown in FIG. 10 and FIG. 11, a plurality of fins 171 and 172 may be provided radially on the rear face of the hot plate 70 and the inner side face of the inner case 66 respectively. The provision of the fins 171 and 172 makes it possible to increase an area in which the hot plate 70 and the inner case 66 touch air discharged from the nozzles 74, resulting in improving the cooling effect of the hot plate 70. Incidentally, FIG. 10 is a side sectional view of the heating and cooling processing unit and different from FIG. 3 in section position. FIG. 11 is a plan view of the heating and cooling processing unit.

Figure 12:
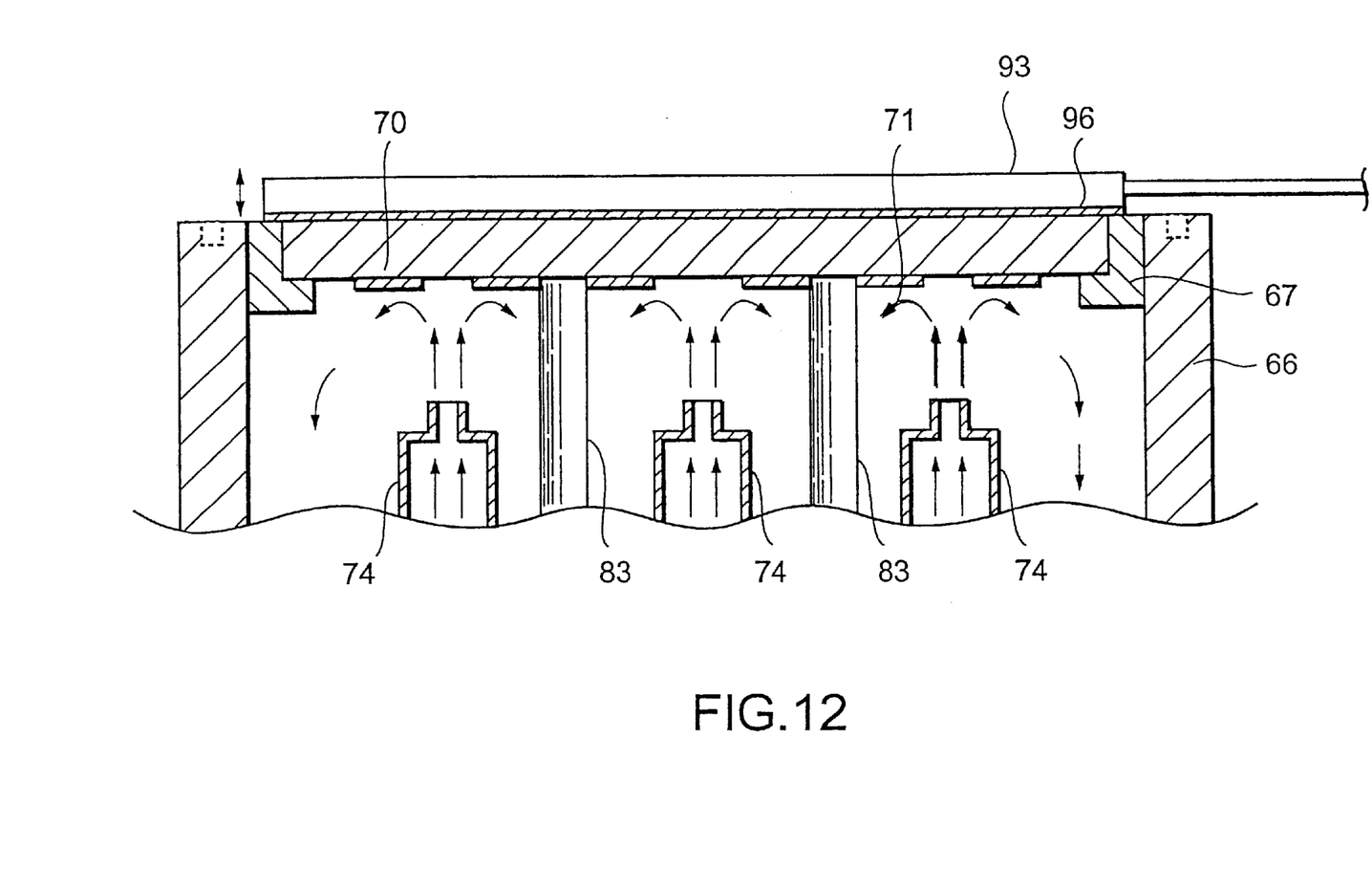
FIG. 12 is a side sectional view showing the state in which a chill plate in a heating and cooling processing unit according to still another embodiment is moved onto a hot plate.

In the aforesaid embodiment, in the state in which the cooling plate 93 is moved on to the hot plate 70, the hot plate 70 and the cooling plate 93 are placed apart from each other. But, it is possible that the cooling plate 93 is designed to be ascendable and descendable, and that the hot plate 70 can be cooled by making the cooling plate 93 and the hot plate 70 touch as shown in FIG. 12, and consequently the cooling rate can be improved as compared with the case where they are apart from each other. In this case, when the hot plate 70 reaches a temperature higher than the predetermined temperature after the cooling plate 93 and the hot plate 70 touch, the cooling plate 93 and the hot plate 70 are separated, so that overshoot can be prevented.

Figure 13:
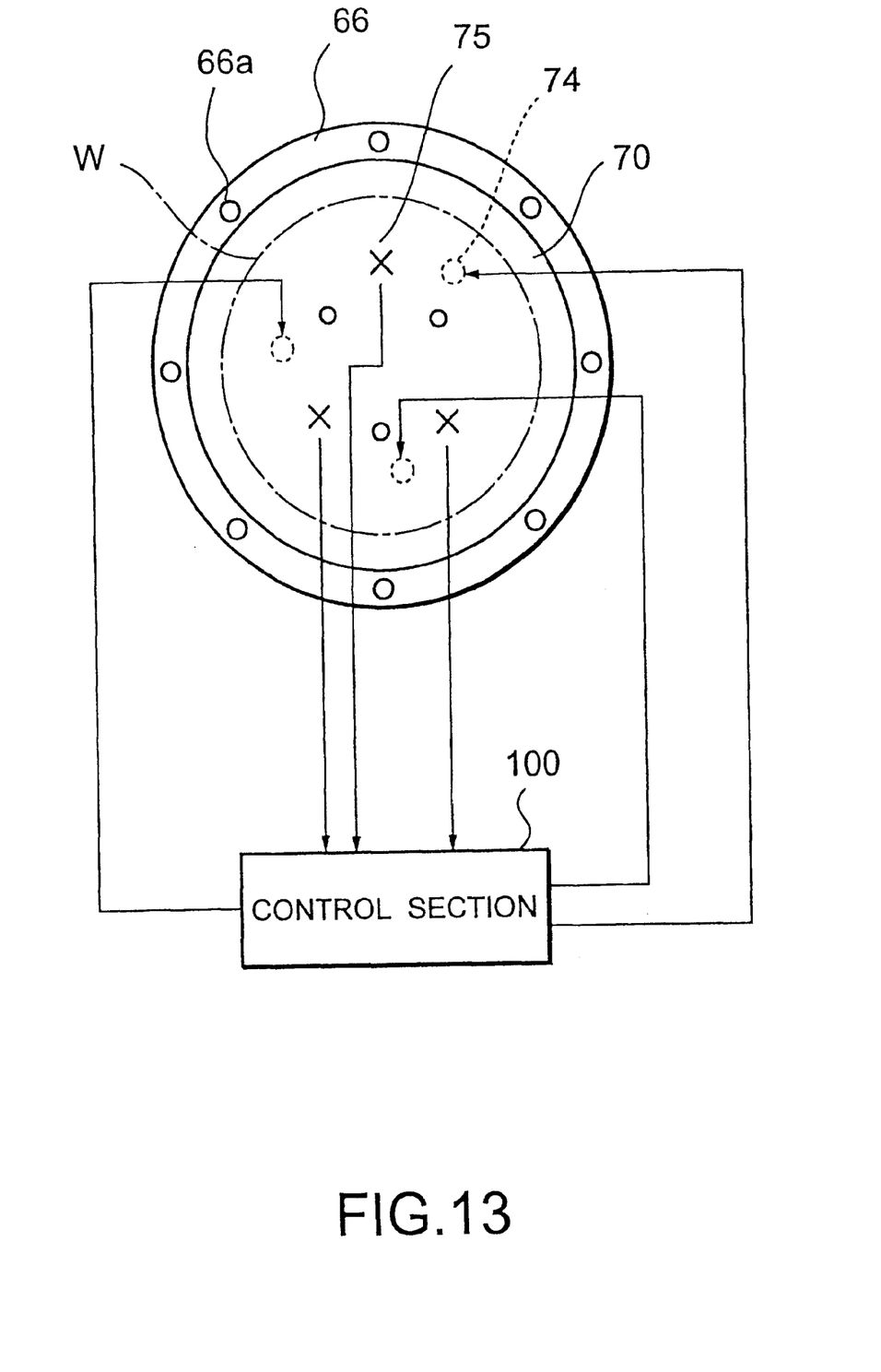
FIG. 13 is a plan view explaining a heating section in a heating and cooling processing unit according to yet another embodiment.

Further, in the aforesaid embodiment, since the nozzles 74 communicate with one another by the same air supply pipe 76, air with the same air velocity is blown onto the rear face of the hot plate 70. As shown in FIG. 13, however, it is possible to provide a control section 100, to which the temperature information of the hot plate 70 measured by the sensors 75 is sent, for controlling the flow rate of air to be discharged from the nozzles 74 and the period of time to let the air flow based on this information to thereby change the flow rate and flow time of air to be discharged from the nozzles 74. The aforesaid provision of the control section 100 enables temperature distribution in the surface of the hot plate 70 to be made more uniform. Incidentally, for easier understanding, the number of the nozzles 74 and the sensors 75 are reduced in FIG. 13.

It should be mentioned that in the aforesaid FIG. 8 to FIG. 13, the same numerals and symbols are given with regard to the same structure as in the aforesaid embodiment.

Furthermore, although constant temperature circulating water is used as a cooling medium circulating in the cooling plate 93 in the aforesaid embodiment, gas such as dry air or the like can be used. Compared with liquids, gas is less expensive, has no leakage like liquid, and can flow smoothly unlike liquids.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A hot plate cooling method, comprising the steps of:
    heating a hot plate, on which a substrate is disposed, to heat the substrate; and
    positioning an object above the hot plate, the object including a portion which faces the hot plate and has a color with good heat absorption efficiency; and
    blowing cooling gas onto the rear face of the hot plate after said step of heating the hot plate.

2. The method as set forth in claim 1, further comprising the steps of:
    placing the substrate on the hot plate and heating the substrate after said step of heating the hot plate; and
    removing the substrate from the top of the hot plate after said step of heating the substrate,
    wherein after said step of removing the substrate from the top of the hot plate, the object is positioned above the hot plate.

3. The method as set forth in claim 1, wherein the color with good heat absorption efficiency is a color having a JIS lightness of 0V to 4V.

4. A hot plate cooling method, comprising the steps of:
    heating a hot plate, on which a substrate is disposed, to heat the substrate; and
    positioning an object above the hot plate, the object including a portion which faces the hot plate and has a color with good heat absorption efficiency;
    wherein a cooling medium circulates in the object, and the object is situated to touch the hot plate.

5. The method as set forth in claim 4, further comprising the steps of:
    placing the substrate on the hot plate and heating the substrate after said step of heating the hot plate; and
    removing the substrate from the top of the hot plate after said step of heating the substrate,
    wherein after said step of removing the substrate from the top of the hot plate, the object is positioned above the hot plate.

6. The method as set forth in claim 4, wherein the color with good heat absorption efficiency is a color having a JIS lightness of 0V to 4V.

7. A heating processing apparatus, comprising:
    a hot plate configured to heat a substrate; and
    an object moving freely over said hot plate, said object including a surface which faces said hot plate and has a color with good heat absorption efficiency.

8. The apparatus as set forth in claim 7, wherein said object is allowed to move so that said hot plate touches the surface facing said hot plate.

9. The apparatus as set forth in claim 7, wherein the color with good heat absorption efficiency is practically a color having a JIS lightness of 0V to 4V.

10. The apparatus as set forth in claim 7, wherein a channel for a cooling medium is formed in said object.

11. The apparatus as set forth in claim 10, wherein the cooling medium is a liquid.

12. The apparatus as set forth in claim 10, wherein the cooling medium is a gas.

13. The apparatus as set forth in claim 7, wherein the surface of said object facing said hot plate is formed into a roughened surface.

14. The apparatus as set forth in claim 7, wherein said object is a transfer machine for transferring the substrate.

15. The apparatus as set forth in claim 7, wherein the surface of said object facing said hot plate is shaped almost exactly into a flat plate to cover said hot plate.

16. The apparatus as set forth in claim 7, further comprising a nozzle configured to blow cooling gas onto a rear face of said hot plate.

17. The apparatus as set forth in claim 16, further comprising a temperature sensor configured to measure the temperature of said hot plate, wherein a position at which the cooling gas is blown out from said nozzle is set at a position away from said temperature sensor.

18. The apparatus as set forth in claim 16, wherein said nozzle comprises a plurality of nozzle members, and said apparatus, further comprises:
    a plurality of temperature sensors each configured to measure the temperature of said hot plate; and
    a control section, to which measurement information measured by said temperature sensors is sent, for controlling the quantity of gas to be discharged from each of said nozzle members based on the measurement information.

19. The apparatus as set forth in claim 16, further comprising:
    a processing chamber in which said hot plate is disposed, the processing chamber having spaces in upper and lower portions thereof with said hot plate being arranged between the upper and lower portions; and
    an exhaust unit configured to perform exhaust operation from within the lower portion of said processing chamber,
    wherein the cooling gas is supplied to the lower portion of said processing chamber, and the quantity of the cooling gas discharged from said nozzle is larger than the exhaust quantity by said exhaust means.

\* \* \* \* \*